United States Patent
Tsai et al.

(10) Patent No.: US 11,942,376 B2
(45) Date of Patent: Mar. 26, 2024

(54) METHOD FOR MANUFACTURING SEMICONDUCTOR STRUCTURE

(71) Applicant: TAIWAN SEMICONDUCTOR MANUFACTURING COMPANY LTD., Hsinchu (TW)

(72) Inventors: Chun Hsiung Tsai, Hsinchu County (TW); Cheng-Yi Peng, Taipei (TW); Ching-Hua Lee, Hsinchu (TW); Chung-Cheng Wu, Hsin-Chu County (TW); Clement Hsingjen Wann, Carmel, NY (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/818,120

(22) Filed: Aug. 8, 2022

(65) Prior Publication Data
US 2022/0384275 A1 Dec. 1, 2022

Related U.S. Application Data

(63) Continuation of application No. 16/404,540, filed on May 6, 2019, now Pat. No. 11,450,571.

(60) Provisional application No. 62/737,384, filed on Sep. 27, 2018.

(51) Int. Cl.
| | |
|---|---|
| H01L 21/8238 | (2006.01) |
| H01L 21/265 | (2006.01) |
| H01L 21/268 | (2006.01) |
| H01L 21/285 | (2006.01) |
| H01L 21/324 | (2006.01) |
| H01L 27/092 | (2006.01) |

(Continued)

(52) U.S. Cl.
CPC .... *H01L 21/823821* (2013.01); *H01L 21/265* (2013.01); *H01L 21/324* (2013.01); *H01L 21/823814* (2013.01); *H01L 21/823828* (2013.01); *H01L 21/823871* (2013.01); *H01L 27/0924* (2013.01); *H01L 29/66795* (2013.01); *H01L 29/785* (2013.01); *H01L 21/26506* (2013.01); *H01L 21/268* (2013.01); *H01L 21/28518* (2013.01)

(58) Field of Classification Search
None
See application file for complete search history.

(56) References Cited

U.S. PATENT DOCUMENTS

2015/0270342 A1* 9/2015 Tsai .................. H01L 29/1608
438/283

* cited by examiner

*Primary Examiner* — Evren Seven
(74) *Attorney, Agent, or Firm* — WPAT LAW; Anthony King

(57) ABSTRACT

Methods of manufacturing a semiconductor structure are provided. One of the methods includes: receiving a substrate including a first conductive region of a first transistor and a second conductive region of a second transistor, wherein the first transistor and the second transistor have different conductive types; performing an amorphization on the first conductive region and the second conductive region; performing an implantation over the first conductive region of the first transistor; forming a contact material layer over the first conductive region and the second conductive region; performing a thermal anneal on the first conductive region and the second conductive region; and performing a laser anneal on the first conductive region and the second conductive region.

20 Claims, 11 Drawing Sheets

(51) Int. Cl.
*H01L 29/66* (2006.01)
*H01L 29/78* (2006.01)

METHOD FOR MANUFACTURING SEMICONDUCTOR STRUCTURE

PRIORITY CLAIM AND CROSS-REFERENCE

This application is a continuation of Ser. No. 16/404,540, filed on May 6, 2019, which claims the benefit of prior-filed provisional application No. 62/737,384, filed on Sep. 27, 2018.

BACKGROUND

The semiconductor integrated circuit (IC) industry has experienced rapid growth. Technological advances in design and IC materials have created successive IC generations each with smaller and more complex circuits than the previous generation. A complex and reduced-sized IC structure is susceptible to defects or physical damage, and small changes in electrical properties of electrical components in the IC structure can result in low performance of the IC structure. For instance, an electrical resistance of the sources and drains in the IC structures can dramatically influence performance of the IC structure. However, even a minor change in a semiconductor manufacturing process is difficult due to high complexities of the manufacturing process and inter-dependent factors influencing different elements and layers of a semiconductor structure.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
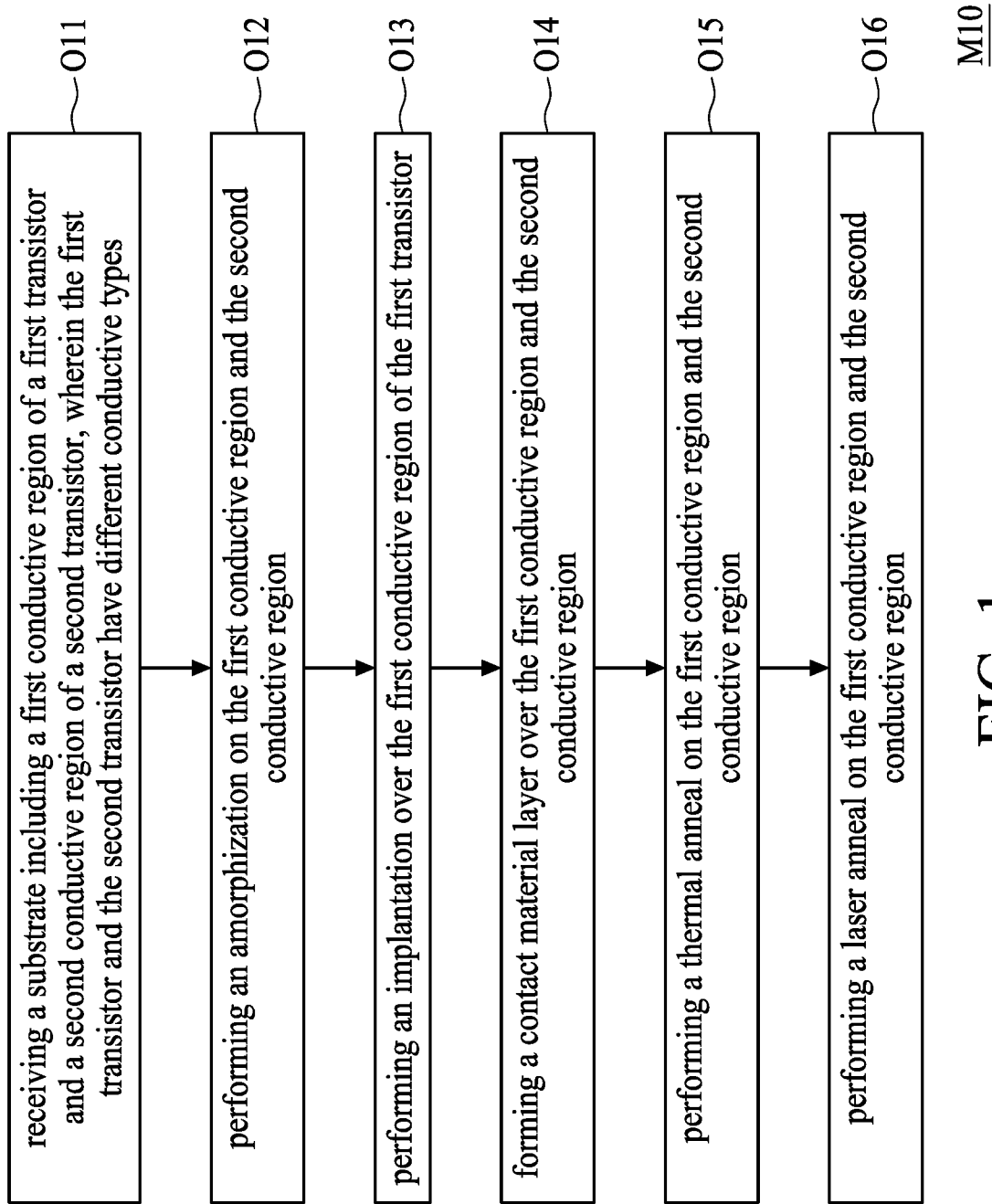
FIG. 1 is a flowchart of a method for manufacturing a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 illustrates a method M10 for manufacturing a semiconductor structure in accordance with some embodiments of the present disclosure. The method M10 includes: (O11) receiving a substrate including a first conductive region of a first transistor and a second conductive region of a second transistor, wherein the first transistor and the second transistor have different conductive types; (O12) performing an amorphization on the first conductive region and the second conductive region; (O13) performing an implantation over the first conductive region of the first transistor; (O14) forming a contact material layer over the first conductive region and the second conductive region; (O15) performing a thermal anneal on the first conductive region and the second conductive region; and (O16) performing a laser anneal on the first conductive region and the second conductive region. It should be noted that the sequence of operations (O11 to O16) as shown in FIG. 1 illustrates merely a spirit of the present disclosure but is not intended to limit a manufacturing sequence of the operations (O11 to O16).

In order to further illustrate concepts of the present disclosure, various embodiments are provided below. However, it is not intended to limit the present disclosure to specific embodiments. In addition, conditions or parameters illustrated in different embodiments can be combined or modified to have different combinations of embodiments as long as the parameters or conditions used are not conflicted.

Figure 2:
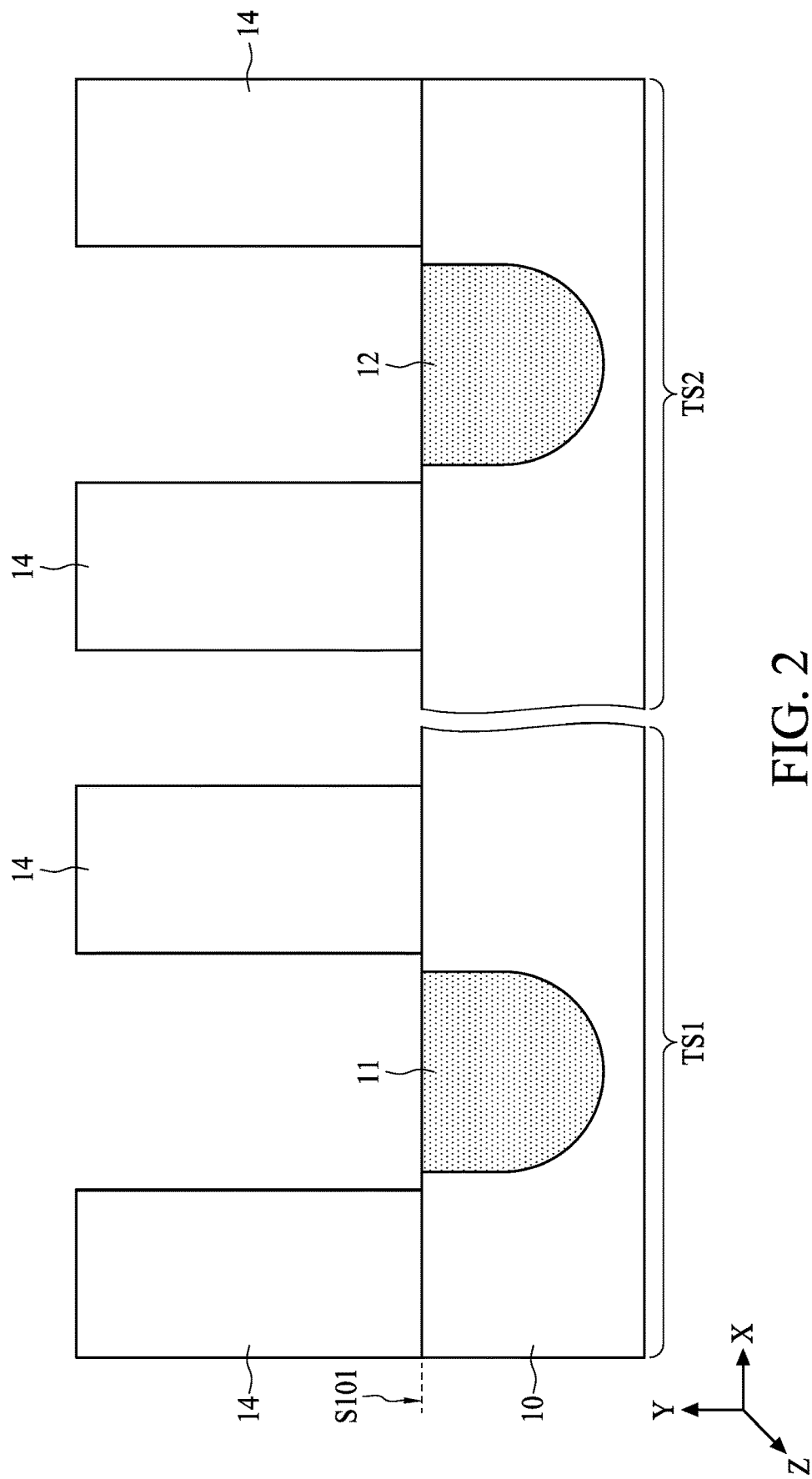
FIGS. 2 to 8 are cross-sectional views of a semiconductor structure during various stages of manufacture in accordance with some embodiments of the present disclosure.

Referring to FIG. 2, in accordance with the operation O11 and some embodiments of the present disclosure, a substrate 10 is received or provided. The substrate 10 includes a transistor TS1 and a second transistor TS2, wherein the first transistor TS1 and the second transistor TS2 have different conductive types. The first transistor TS1 and the second transistor TS2 individually can represent a group of transistors having the same conductive type; however, for ease of illustration, only a portion of the first transistor TS1 and the second transistor TS2 are shown in FIGS. 2 to 8. A singular first transistor TS1 and a singular second transistor TS2 are used in the flowing description.

Figure 11:
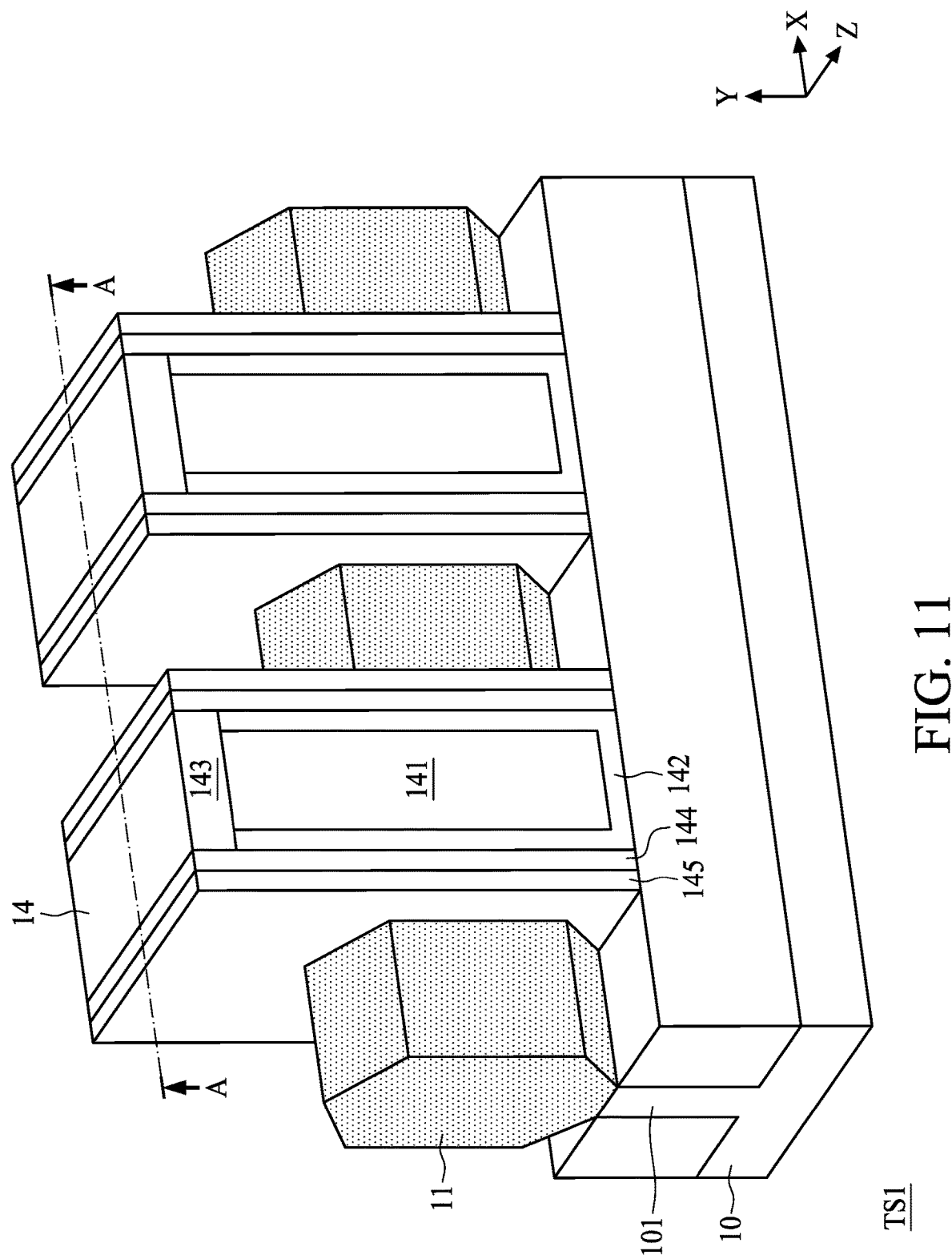
FIG. 11 is a three-dimensional diagram of one or more transistors in accordance with some embodiments of the present disclosure.

In some embodiments, the first transistor TS1 is a PMOS (P-type metal oxide semiconductor) transistor, and the second transistor TS2 is an NMOS (N-type metal oxide semiconductor) transistor. In some embodiments, the first transistor TS1 is an NMOS and the second transistor TS2 is a PMOS. For ease of understanding and illustration, the embodiments including the first transistor TS1 as a PMOS and the second transistor TS2 as an NMOS are used in the following description. The first transistor TS1 includes a first conductive region 11 formed in the substrate 10, and the second transistor TS2 includes a second conductive region 12 formed in the substrate 10. In some embodiments the first transistor TS1 and the second transistor TS2 being fin field effect transistors (FinFETs), the first conductive region 11 and the second conductive region 12 are formed in a fin structure 101 of the substrate 10 as shown in FIG. 11, wherein FIG. 11 shows merely a portion of the first transistor TS1 for a purpose of ease of illustration. A cross-sectional perspective of the first transistor TS1 along a line A-A' shown in FIG. 11 is similar to the cross-sectional diagram of the first transistor TS1 shown in FIG. 2. A three dimensional diagram of the second transistor TS2 can be similar to the first transistor TS1 shown in FIG. 2, and a repeat figures is omitted. In some embodiments, the conductive regions 11 and 12 are formed in the fin structure of the substrate 10. In some embodiments, the first and second conductive regions 11 and 12 are formed by epitaxial growth, and the first and second conductive regions 11 and 12 at this stage are entirely crystalline. Configurations of the first conductive region 11 and/or the second conductive region 12 depend on different epitaxial techniques, and it is not limited herein. In some embodiments, the first and second conductive regions 11 and 12 can include germanium (Ge), silicon germanium (SiGe), silicon carbide (SiC), silicon phosphorus (SiP), silicon germanium carbon (SiGeC), silicon carbon phosphorus (SiCP) or other suitable materials.

A plurality of gate structures 14 are formed over the substrate 10 adjacent to the first conductive region 11 and the second conductive region 12, and on a top surface S101 of the substrate 10. In some embodiments, the plurality of gate structures 14 is formed over and across the fin structure of the substrate 10. In some embodiments, the gate structures 14 are formed after the formation of the fin structure and prior to the formation of the first and second conductive regions 11 and 12. In some embodiments as shown in FIG. 11, the gate structures 14 are extended across and perpendicular to the fin structure 101 (e.g. in the embodiments, the fin structure of 101 the substrate 10 is extended along the X direction, and the gate structures are extended along the Z direction). In some embodiments, the gate structures 14 are polysilicon gate structures. In some embodiments, the gate structures 14 are metal gate structures. A type of the gate structures 14 is not limited herein. In some embodiments, each of the gate structures 14 includes a gate electrode 141, a gate dielectric 142, a hard mask 143, a pair of spacers 144, and a dielectric material 145. The gate dielectric 142 surrounds the gate electrode 141 and is disposed between the gate electrode 141 and the spacers 144, and the gate dielectric 142 is also disposed between the gate electrode 141 and the fin structures 101. The hard mask 143 is disposed on a top of the gate electrode 141 and between the pair of spacers 144. The pair of spacers 144 is disposed on two lateral sidewalls of the stack of the gate electrode 141 and the hard mask 143. The dielectric material 145 is disposed on two lateral sidewalls of the stack of the gate electrode 141, the hard mask 143 and the pair of spacers 144. Detailed configurations of the gate structure 14 are not limited herein.

Figure 3:
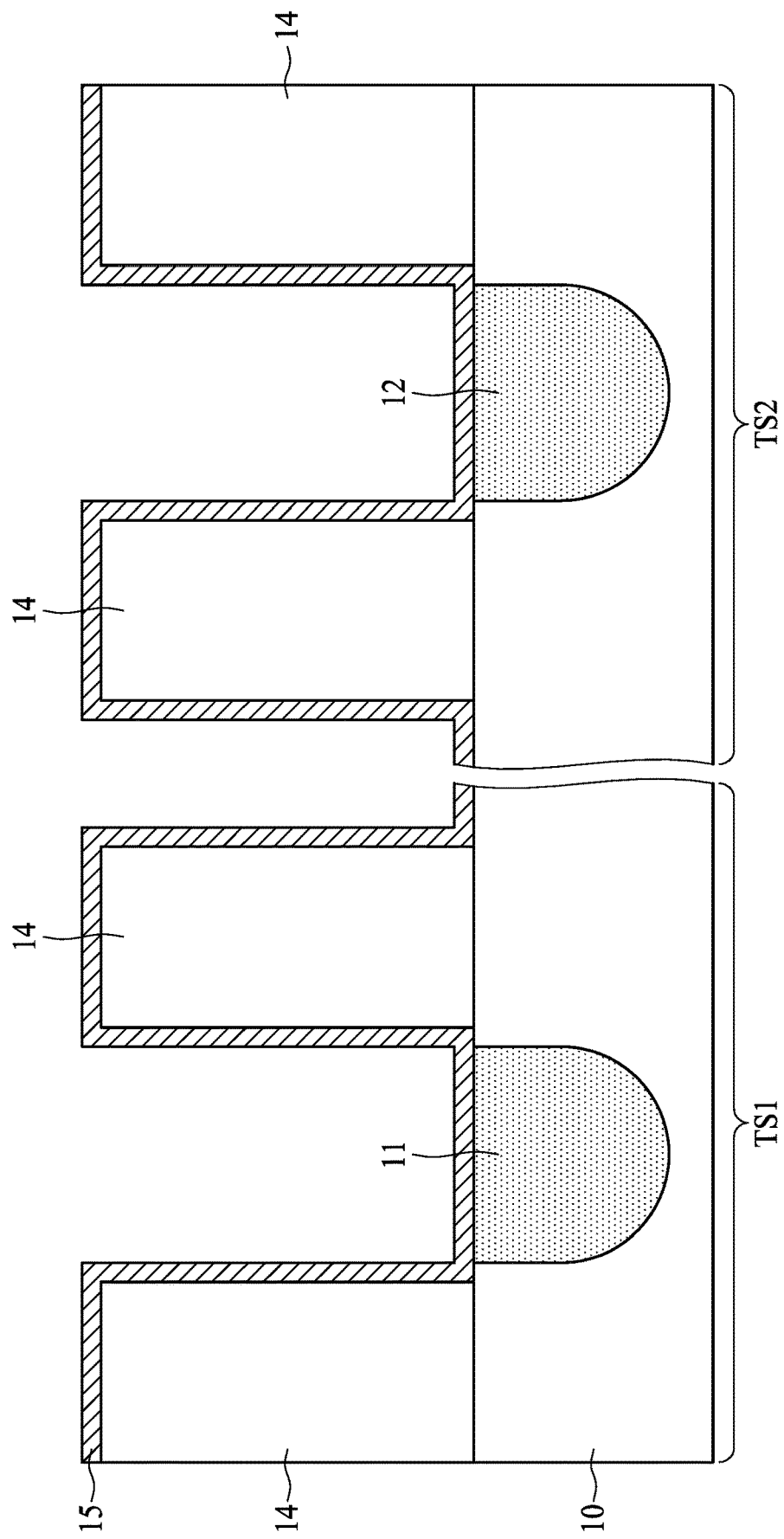

Referring to FIG. 3, in accordance with some embodiments of the present disclosure, the method M10 further includes forming a linear layer 15 conformally over the substrate 10 and the gate structures 14. In some embodiments, spacers of the gate structures 14 (e.g. the dielectric material 145 and/or the spacers 144 shown in FIG. 11) are consumed during the manufacturing process, and a thickness of the spacers are reduced. In some embodiments, a deposition operation is performed to form the linear layer 15 over the gate structures 14 to compensate the consumed spacers of the gate structures 14. In some embodiments, the linear layer 15 is made of the same material(s) of the spacers of the gate structures 14. In some embodiments, a material of the linear layer 15 is dielectric, and the linear layer 15 is also formed over the first conductive region 11 and the second conductive region 12. The linear layer 15 has a profile conformal to a profile of the substrate 10 and the gate structures 14. In some embodiments, the linear layer 15 includes silicon oxide ($SiO_x$), silicon nitride ($Si_xN_y$), boron nitride (BN), germanium nitride (GeN), silicon carbonitride (SiCN), silicon oxycarbonitride (SiOCN), silicon oxynitride (SiON), silicon oxycarbide (SiOC), or a combination thereof, wherein X and Y are integers. In some embodiments, the linear layer 15 is formed by conformal deposition.

Figure 4:
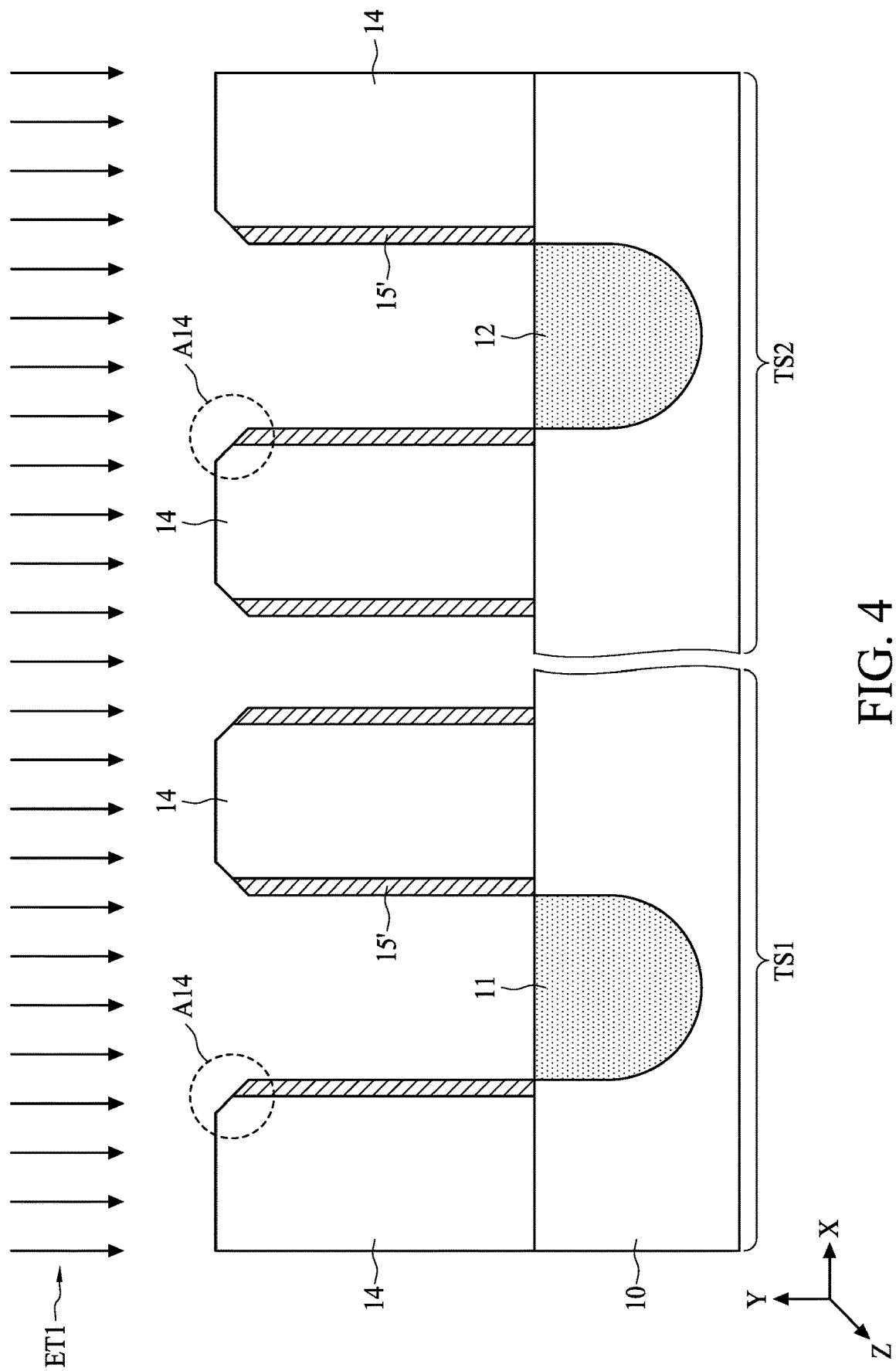

Referring to FIG. 4, in accordance with some embodiments of the present disclosure, the method M10 further includes performing an etching operation ET1 to remove portions of the linear layer 15 to form sidewalls 15' on two lateral sides of each of the gate structures 14. As illustrated in FIG. 3 above, in some embodiments, the first conductive region 11 and the second conductive region 12 are covered by the linear layer 15, and a purpose of the etching operation ET1 is to expose the first and second conductive regions 11 and 12 for the following silicide formation. In some embodiments, the etching operation ET1 is a directional dry etch applied over the substrate 10 and the gate structures 14. In some embodiments, the directional dry etch includes a vertical (vertically towards the top surface S101 of the substrate 10) anisotropic reactive ion etch (RIE) (e.g. performed along the Y direction towards the substrate 10, which is orthogonal to the X-Z plane) targeted to remove horizontal portions (the portions extending parallel to the top surface S101 of the substrate 10) of the linear layer 15. Portions of the linear layer 15 over the first conductive region 11 and the second conductive region 12 are removed, and portions of the linear layer 15 on tops of the gate structures 14 are also removed. The first conductive region 11 and the second conductive region 12 are exposed. In some embodiments, portions of corners A14 of the gate structure 14 are removed by the etching operation ET1 as shown in FIG. 4. In some embodiments, the corners A14 are oblique corners as shown in FIG. 4 after the etching operation ET1. In some embodiments, the corners A14 are rounded corners (not shown) after the etching operation ET1.

In some embodiments, formation of the linear layer 15 is for a purpose of compensation of the spacers of the gate structures 14 consumed in the previous operations. For example, the previous operations include an etching operation targeted to remove a portion of the fin structure using the gate structures 14 as a mask in order to grow the conductive regions 11 and 12. In some embodiments, removal of the portions of the linear layer 15 is for exposure of the first conductive region 11 and the second conductive region 12 for the subsequent operations performed on the first conductive region 11 and the second conductive region 12.

Figure 5:
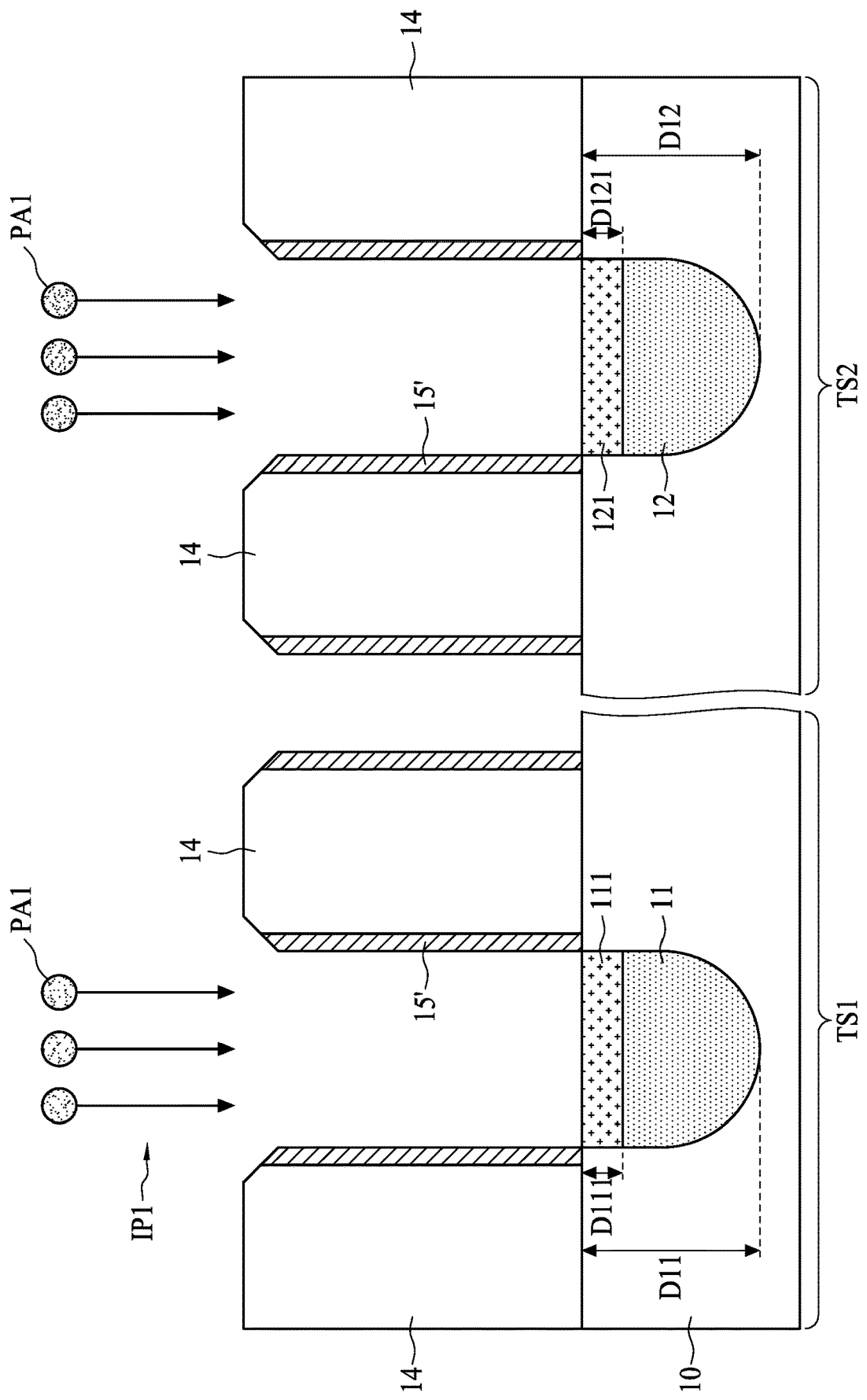

Referring to FIG. 5, in accordance with the operation O12 and some embodiments of the present disclosure, an amorphization IP1 is performed on the first conductive region 11 and the second conductive region 12. The amorphization IP1 causes damage to crystal lattices of the first conductive region 11 and the second conductive region 12. Crystal defects and dislocation densities of the first and second conductive regions 11 and 12 are increased, and portions of the first and second conductive regions 11 and 12 are particularly impacted by a first substance PA1 of the amorphization IP1. A first amorphous structure 111 is formed in the first conductive region 11 by transforming a portion of the crystalline structure of the first conductive region 11 into amorphous form. A second amorphous structure 121 is formed in the second conductive region 12 by transforming a portion of the crystalline structure of the second conductive region 12 into amorphous form.

In some embodiments, the amorphization IP1 includes implantation with non-doping ion species being the first substance PA1 to the exposed first and second conductive regions 11 and 12. The first substance PA1 is selected from elements or ions that do not alter chemical or conductive properties of the first and second conductive regions 11 and 12. In some embodiments, the first substance PA1 is selected from elements included in the first and second conductive regions 11 and 12, or inert atoms. In some embodiments, the first substance PA1 is selected from one or more elements in the group IVA and VIIIA in the periodic table. In some embodiments, the first substance PA1 is selected from one or more elements in the group of germanium and silicon. In some embodiments, the first substance PA1 includes one or more noble gases, e.g. argon, helium, and/or the like. For better amorphization result, argon has precedence over helium due to argon's larger atomic size.

During the amorphization IP1, process parameters, such as operation energy and ions/atoms concentration, and an ion beam current is adjusted to obtain sufficient lattice damage in the first conductive region 11 and the second conductive region 12. The amorphization IP1 functions to establish desired vertical dopant profiles adjacent to channel regions of the first transistor TS1 and the second transistor TS2. The lattice damage in the first and second conductive regions 11 and 12 can reduce channeling effects during subsequent ion implantations and also enhance silicide formation to a desired phase transformation of a silicide layer formed in the subsequent operations. In some embodiments, the amorphization IP1 includes performing an implantation with germanium (i.e. the germanium being the first substance PA1). In some embodiments, an ion energy of the implantation is in a range of 3 keV to 10 keV, and a germanium concentration is in a range of 4E14 atom/$cm^2$ to 5E13 atom/$cm^2$. In some embodiments, a depth D11 of the first conductive region 11 is in a range of 40-60 nanometers, and a depth D111 of the first amorphous structure 111 formed by the amorphization IP1 is in a range of 5-10 nanometers. In some embodiments, a depth D12 of the second conductive region 12 is in a range of 40-60 nanometers, and a depth D121 of the second amorphous structure 121 formed by the same amorphization IP1 is in also a range of 5-10 nanometers. The depths D111 and D121 of the first and second amorphous structures 111 and 121 respectively can be controlled by the ion energy and ion concentration of the implantation.

As illustrated above, the operation O12 functions to impact the first conductive region 11 and the second conductive region 12 with the first substance PA1 as shown in FIG. 5. Crystalline densities of the first conductive region 11 and the second conductive region 12, and particularly the crystalline densities of the surface portions (i.e. the first and second amorphous structures 111 and 121 in FIG. 5) of the conductive regions 11 and 12, are decreased by the operation O12. The surface portions referred to herein are relative to portions that are proximal to surfaces of the conductive regions 11 and 12 and adjacent to the gate structures 14. The resulting crystalline densities of the first conductive region 11 and the second conductive region 12 are similar or substantially the same, and are indicated as a first reduced crystalline density in the following description. The first reduced crystalline density is less than crystalline densities of the conductive regions 11 and 12 before the operation O12 (which are indicated as original crystalline densities of the conductive regions 11 and 12 in the following description). It should be noted that a change of crystalline densities prior to and after the amorphization IP1 occurs mostly in the first and second amorphous structures 111 and 121 of the conductive regions 11 and 12, respectively.

In, the operation O12 functions to increase amorphous densities of the first conductive region 11 and the second conductive region 12, especially the surface portions of the conductive regions 11 and 12. The surface portions referred to herein are relative to portions that are proximal to surfaces of the conductive regions 11 and 12 and adjacent to the gate structures 14. The surfaces of the conductive regions 11 and 12 are respectively exposed from the gate structures 14, and optionally exposed from the sidewalls 15'. The depth D111 of the first amorphous structure 111 and the depth D121 of the second amorphous structure 121 are measured from the surfaces exposed from the gate structures 14 and extended down to bottoms of the conductive regions 11 and 12, respectively, in the substrate 10. It should be noted that an increase in the amorphous densities of the first conductive region 11 is mostly concentrated in the first amorphous structure 111. Similarly, an increase in the amorphous densities of the second conductive region 12 is mostly concentrated in the second amorphous structure 121.

Figure 6:
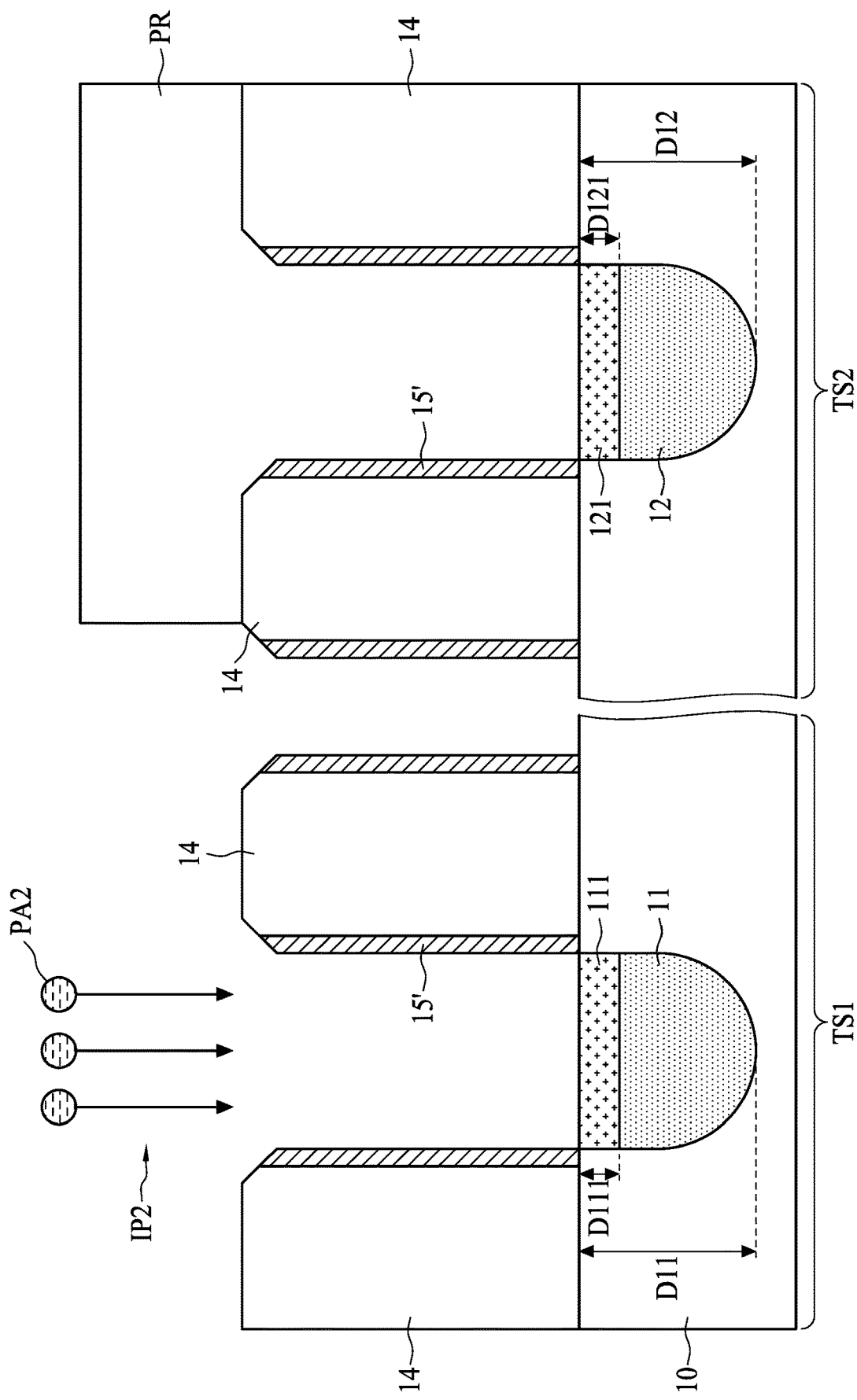

Referring to FIG. 6, in accordance with the operation O13 and some embodiments of the present disclosure, an implantation IP2 is performed over the first conductive region 11 of the first transistor TS1. In some embodiments as shown in FIG. 6, a photoresist PR is formed over the second transistor TS2 to cover and protect the second conductive region 12 from the implantation IP2. In some embodiments, a second substance PA2 is implanted or introduced into the first conductive region 11, especially into the first amorphous structure 111 of the first conductive region 11 due to grain boundary barriers between the crystalline lattice and the first amorphous structure 111. In some embodiments, the second substance PA2 includes boron. The photoresist PR is removed after the implantation IP2.

In the embodiments, the first transistor TS1 is a PMOS transistor, and the implantation IP2 is for a purpose of ion doping into the source/drain region of the first transistor TS1. In the embodiments, the source/drain region of the first transistor TS1 is formed by epitaxial growth of silicon germanium (SiGe) of the first conductive region 11 and implantation IP2 to introduce dopants into the first conductive region 11. In the embodiments, the second transistor TS2 is an NMOS transistor, and the source/drain region of the second transistor TS2 is formed by epitaxial growth of silicon phosphorus (SiP) of the second conductive region 12, and no extra implantation or doping operation is required. However, it is not intended to limit the present disclosure. Another implantation can be performed to dope the second transistor TS2 in other applications while the first transistor TS1 is protected by a mask.

In some embodiments, a crystalline density of the first amorphous structure 111 of the first conductive region 11 is further decreased by the implantation IP2. A crystalline density of the first conductive region 11 is decreased from the first reduced crystalline density to a second reduced crystalline density by the implantation IP2. The second reduced crystalline density is less than the first reduced crystalline density. In the embodiments, after the implantation IP2, a crystalline density of the second conductive region 12 remains the same as the first reduced crystalline density.

Figure 7:
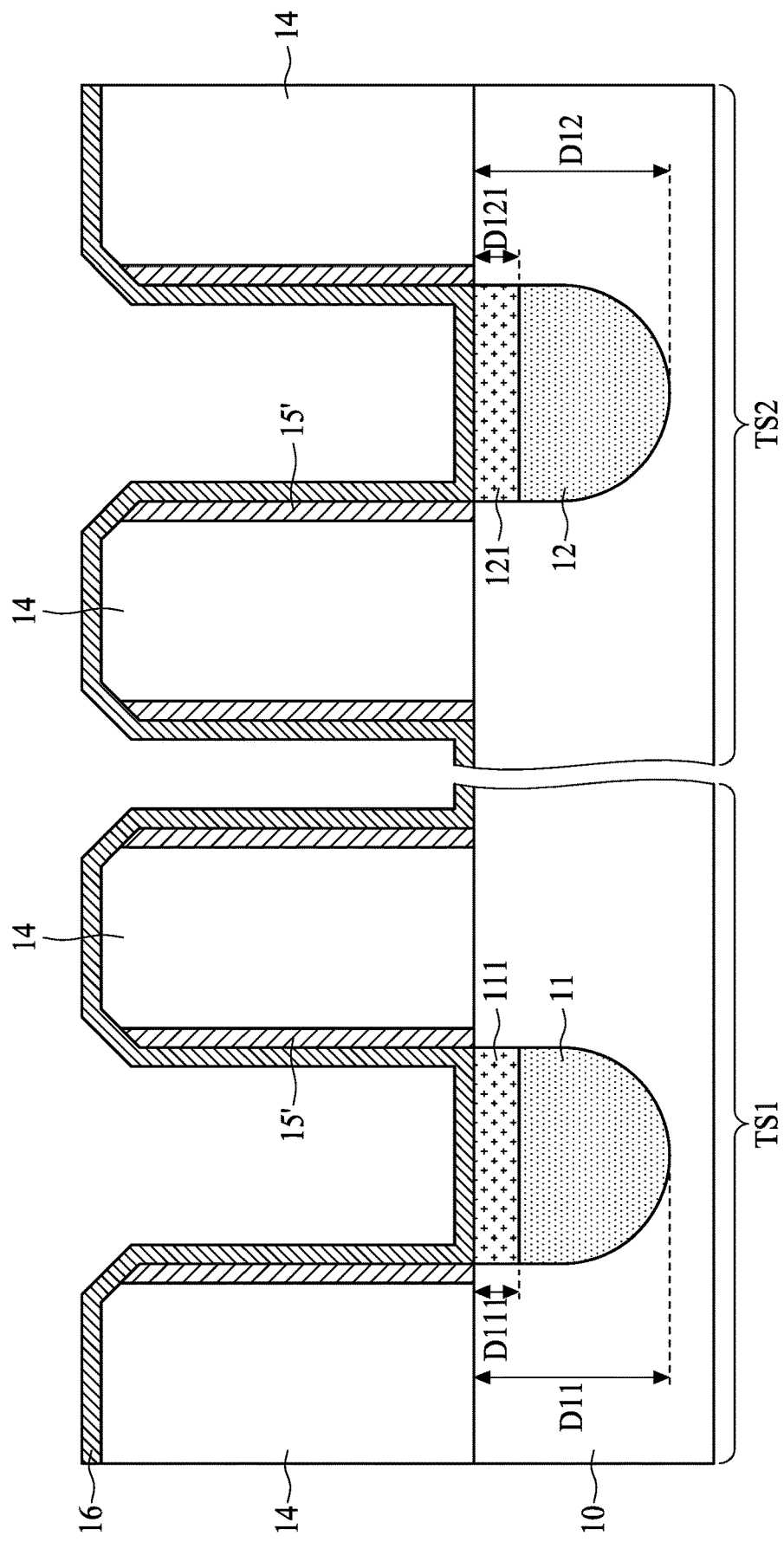

Referring to FIG. 7, in accordance with the operation O14 and some embodiments of the present disclosure, a contact material layer 16 is formed over the first conductive region 11 and the second conductive region 12. In some embodiments, the contact material layer 16 is conformally formed over the substrate 10 and physically contacts the first amorphous structure 111 of the first conductive region 11 and the second amorphous structure 121 of the second conductive region 12. The contact material layer 16 has a profile conformal to a profile of the conductive regions 11 and 12 and the gate structures 14. In some embodiments, the contact material layer 16 includes titanium (Ti), tantalum (Ta), erbium (Er), yttrium (Y), ytterbium (Yb), europium (Eu), terbium (Tb), lutetium (Lu), thorium (Th), scandium (Sc), hafnium (Hf), zirconium (Zr), chromium (Cr), niobium (Nb), ruthenium (Ru), cobalt (Co), nickel (Ni), platinum (Pt), tungsten (W), other suitable metals, compounds containing above metal (e.g. nitride compounds containing the listed metal), or a combination thereof. In some embodiments, the contact material layer 16 is a multi-layered structure. In some embodiments, the contact material layer 16 includes a titanium (Ti) sub-layer and a titanium nitride (TiN) sub-layer formed thereon (not shown in the figures). In some embodiments, the contact material layer 16 is formed by conformal deposition, chemical vapor deposition (CVD), physical vapor deposition (PVD) or any other suitable operations. In some embodiments, the operation O14 is performed immediately after the implantation IP2.

Figure 8:
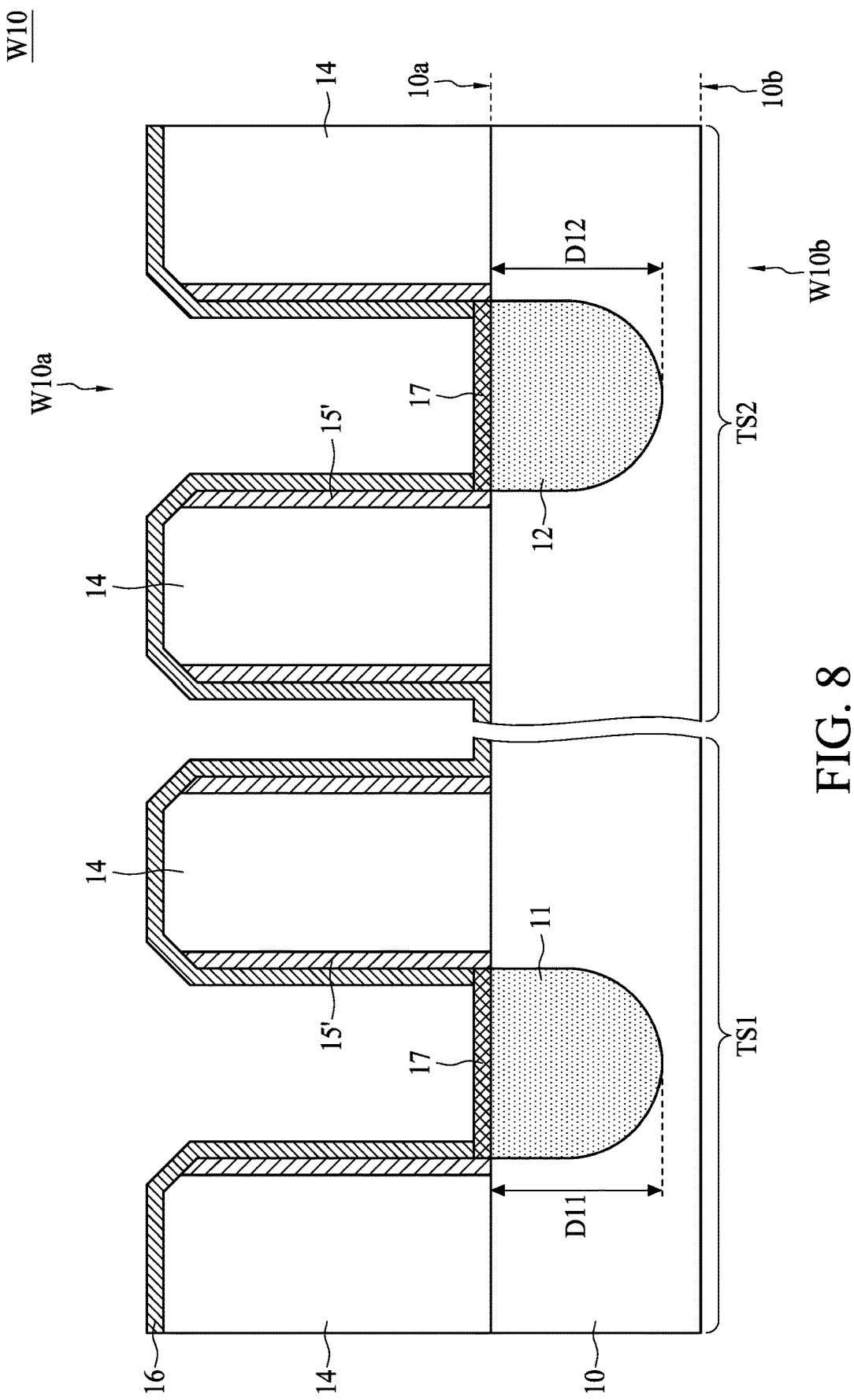

Referring to FIG. 8, in accordance with the operations O15 and O16 and some embodiments of the present disclosure to form a semiconductor structure W10, a thermal anneal and a laser anneal are performed on the first conductive region 11 and the second conductive region 12, thereby forming a silicide layer 17 over the first conductive region 11 and the second conductive region 12 and re-crystallizing the first and second amorphous structures 111 and 121. In some embodiments, the operations O15 and O16 (the thermal anneal and the laser anneal) are performed over a semiconductor structure W10. In some embodiments, the semiconductor structure W10 is a part of a die, a wafer, a device or a package. In some embodiments, the silicide layer 17 contains the metal element of the contact material layer 16. In some embodiments, the silicide layer 17 includes titanium silicide (TiSi). In some embodiments, a temperature difference between the laser anneal and the thermal anneal is greater than or equal to 150 degrees Celsius (t). In some embodiments, a temperature of the thermal anneal is lower than a temperature of the laser anneal. In some embodiments, a duration of the thermal anneal is greater than a duration of the laser anneal.

In some embodiments, a first side W10a of the semiconductor structure W10 over which the gate structures 14 are disposed is referred to as a "front side", and a second side W10b of the semiconductor structure W10 opposite to the first side W10a of the semiconductor structure W10 is referred to as a "back side". In some embodiments, a first surface 10a of the substrate 10 proximal to or facing to the first side W10a of the semiconductor structure W10 is referred to as a "front surface". In some embodiments, the contact material layer 16 at the first surface 10a of the substrate 10 is exposed. In some embodiments, a second surface 10b of the substrate 10 opposite to the first surface 10a of the substrate 10 is referred to as a "back surface".

The thermal anneal in the present disclosure is to provide heat in a way of broad spectrum (instead of discrete lines). In some embodiments, types of the thermal anneal include furnace-based anneal and lamp-based anneal. In some embodiments, the whole substrate 10 or the whole semiconductor structure W10 is heated upon the thermal anneal. In some embodiments, only the first surface 10a of the substrate 10 or the first side W10a of the semiconductor structure W10 is heated upon the thermal anneal. In some embodiments, the thermal anneal is to provide heat for both the first side W10a and the second side W10b of the semiconductor structure W10. In some embodiments, the thermal anneal is to provide heat for only the second side W10b of the semiconductor structure W10, and the first surface 10a of the substrate 10 or the first side W10a of the semiconductor structure W10 is heated upon by heat conduction. In some embodiments, the thermal anneal is to provide heat for both the first surface 10a and the second surface 10b of the substrate 10. In some embodiments, the thermal anneal is to provide heat for only the second surface 10b of the substrate 10.

The laser anneal in the present disclosure is to provide energy directly onto the substrate 10 or the semiconductor structure W10. In some embodiments, the laser anneal is to provide energy onto a part of the substrate 10 or a part of the semiconductor structure W10. In some embodiments, the laser anneal is to provide energy onto the first surface 10a of the substrate 10 or the first side W10a of the semiconductor structure W10. In some embodiments, laser beams of the laser anneal is projected directly onto the first surface 10a of the substrate 10 or the first side W10a of the semiconductor structure W10, in a way of discrete lines (instead of broad spectrum). In some embodiments, the laser anneal is to provide energy onto a part of the front surface 10a of the substrate 10 or a part of the first side W10a of the semiconductor structure W10. In some embodiments, the laser anneal is to project laser beams by a laser projector in a way of point scanning or line scanning.

Annealing operations provides energy to facilitate reactions between layers or within a material. Diffusions, between the first conductive region 11 and a portion of the contact material layer 16 thereon, and between the second conductive region 12 and a portion of the contact material layer 16 thereon, are driven to form the silicide layer 17 on the conductive regions 11 and 12. The silicide layer 17 is formed from portions of the contact material layer 16 contacting the conductive regions 11 and 12 respectively. Repair of crystal lattices of the first amorphous structure 111 of the first conductive region 11 and the second amorphous structure 121 of the second conductive region 12 are also facilitated by the annealing operations. The first amorphous structure 111 and the second amorphous structure 121 are re-crystallized into crystalline.

In some embodiments, a temperature and a duration of the thermal anneal is controlled in certain ranges to control a thermal budget for designed phase transformation of the silicide layer 17. A phase of lattice of the silicide layer 17 is shifted during the thermal anneal. The designed phase transformation of the silicide layer 17 is not limited herein. A plane orientation of the designed phase transformation of the silicide layer 17 is application dependent. The designed phase transformation is designed to provide a desired resistance of source/drain contacts of a semiconductor device. In some embodiments, the temperature of the thermal anneal is in a range of 500 to 650 degrees Celsius (t). In some embodiments, the duration of the thermal anneal is in a scale of seconds. In some embodiments, the duration of the thermal anneal is in a range of 10 to 30 seconds. In some embodiments, the thermal anneal serves to heat the substrate 10 in a process chamber from a front side and a back side of the substrate 10. In some embodiments, the thermal anneal is a rapid thermal anneal.

In some embodiments, the re-crystallization of the first amorphous structure 111 and the second amorphous structure 121 are dominated by the laser anneal due to higher temperature, which is required to drive repair and recovery of lattice defects. In some embodiments, a temperature and a duration of the laser anneal is controlled in certain ranges for a purpose of crystal repair. A thermal budget of the laser anneal is also controlled to avoid alteration of the designed phase transformation of the silicide layer 17. The laser anneal includes laser spike anneal (LSA), dynamic surface anneal (DSA), melt laser anneal (MLA), ultra sub-second anneal (uSSA), or other suitable laser anneal technique. In some embodiments, the temperature of the laser anneal is in a range of 800 to 950 degrees Celsius (t). In some embodiments, the laser anneal functions to heat the substrate 10 in the process chamber from the front side of the substrate 10 by laser beam. In some embodiments, the duration of the laser anneal is in a scale of microseconds. In some embodiments, the duration of the laser anneal is in a range of 200 to 400 microseconds. In some embodiments, a thermal budget of the laser anneal is less than a thermal budget of the thermal anneal. In some embodiments, the dopant activation is also achieved by the laser anneal of the operation O16.

In some embodiments, the laser anneal is performed prior to the thermal anneal. In other embodiments, the thermal anneal is performed prior to the laser anneal. As illustrated above, the re-crystallization of the first and second amorphous structures 111 and 121 is dominated by the laser anneal due to higher temperature. On the other hand, the formation of the silicide layer 17 can be dominated by the laser anneal or the thermal anneal depending on which is performed first. In both circumstances, the phase transformation is shifted or adjusted by the thermal anneal. However, it is observed that an electrical resistance uniformity of the silicide layer 17 across a wafer of the thermal-first embodiments tends to be better than that of the laser-first embodiments. In the thermal-first embodiments, the formation of the silicide layer 17 is dominated by the thermal anneal. The thermal anneal provides better thermal uniformity across the wafer than the laser anneal due to longer duration of the thermal anneal and also due to the scattering effect of the laser anneal.

The operation O16 is performed to increase crystalline densities of the first conductive region 11 and the second conductive region 12 by the laser anneal. The crystalline densities of the first and second conductive regions 11 and 12 in the operation O16 are increased from the second reduced crystalline density and/or the first reduced crystalline density respectively. In other words, the laser anneal in the operation O16 is performed to decrease an amorphous density of the first conductive region 11 and also an amorphous density of the second conductive region 12 by re-crystallizing at least a portion of first the amorphous structure 111 and at least a portion of second the amorphous structure 121. It should be noted that crystal structures of the first and second amorphous structures 111 and 121 of the conductive regions 11 and 12 respectively may not be repaired or recovered to be the same as the crystal structures of the conductive regions 11 and 12 prior to the amorphization IP1. FIG. 8 is for illustration only, and is not intended to limit the present disclosure. However, the operation O16 of the mothed M10 can significantly increase the crystalline densities of the conductive regions 11 and 12.

Figure 9:
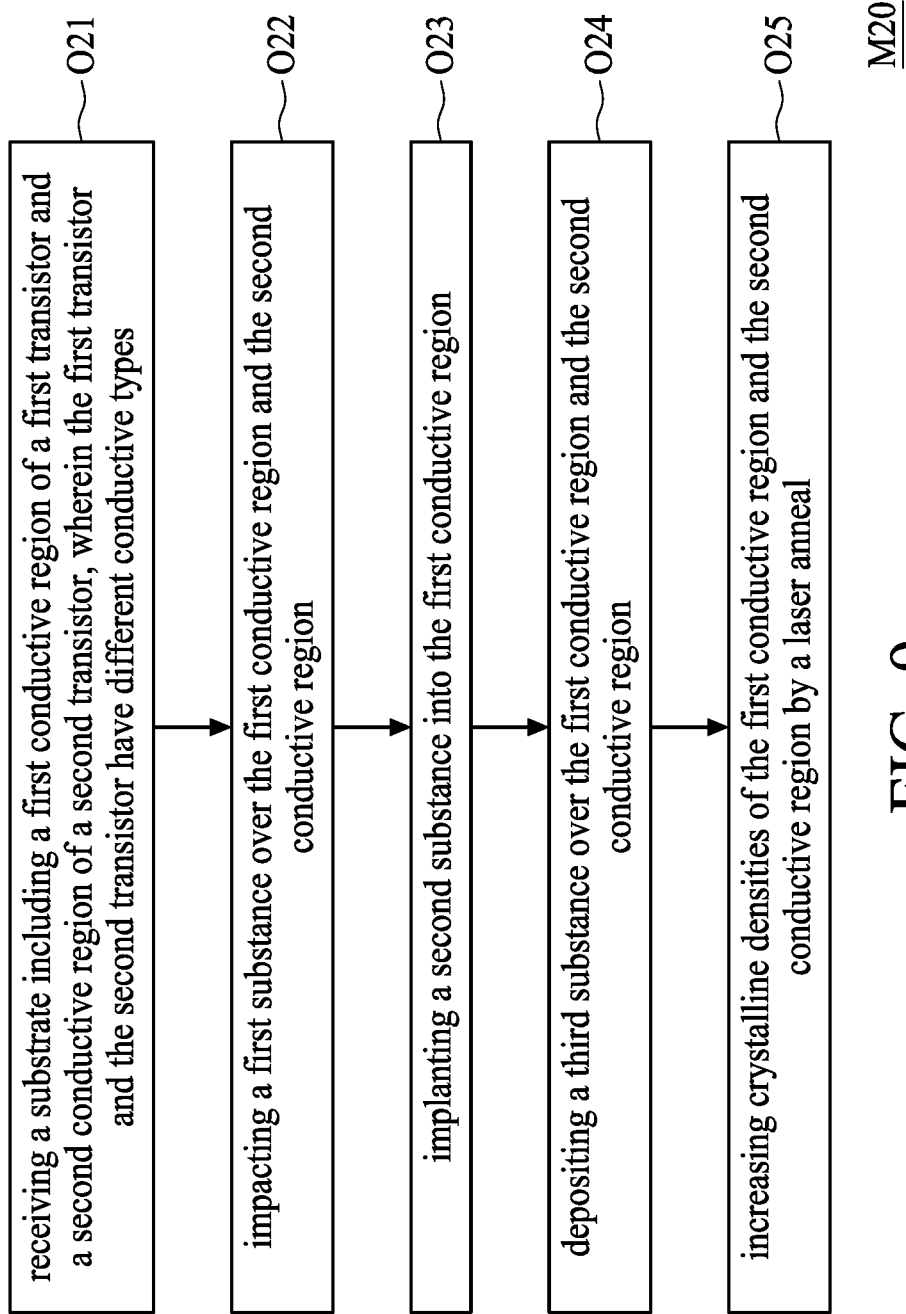
FIG. 9 is a flowchart of a method for manufacturing a semiconductor structure in accordance with some embodiments of the present disclosure.
Figure 10:
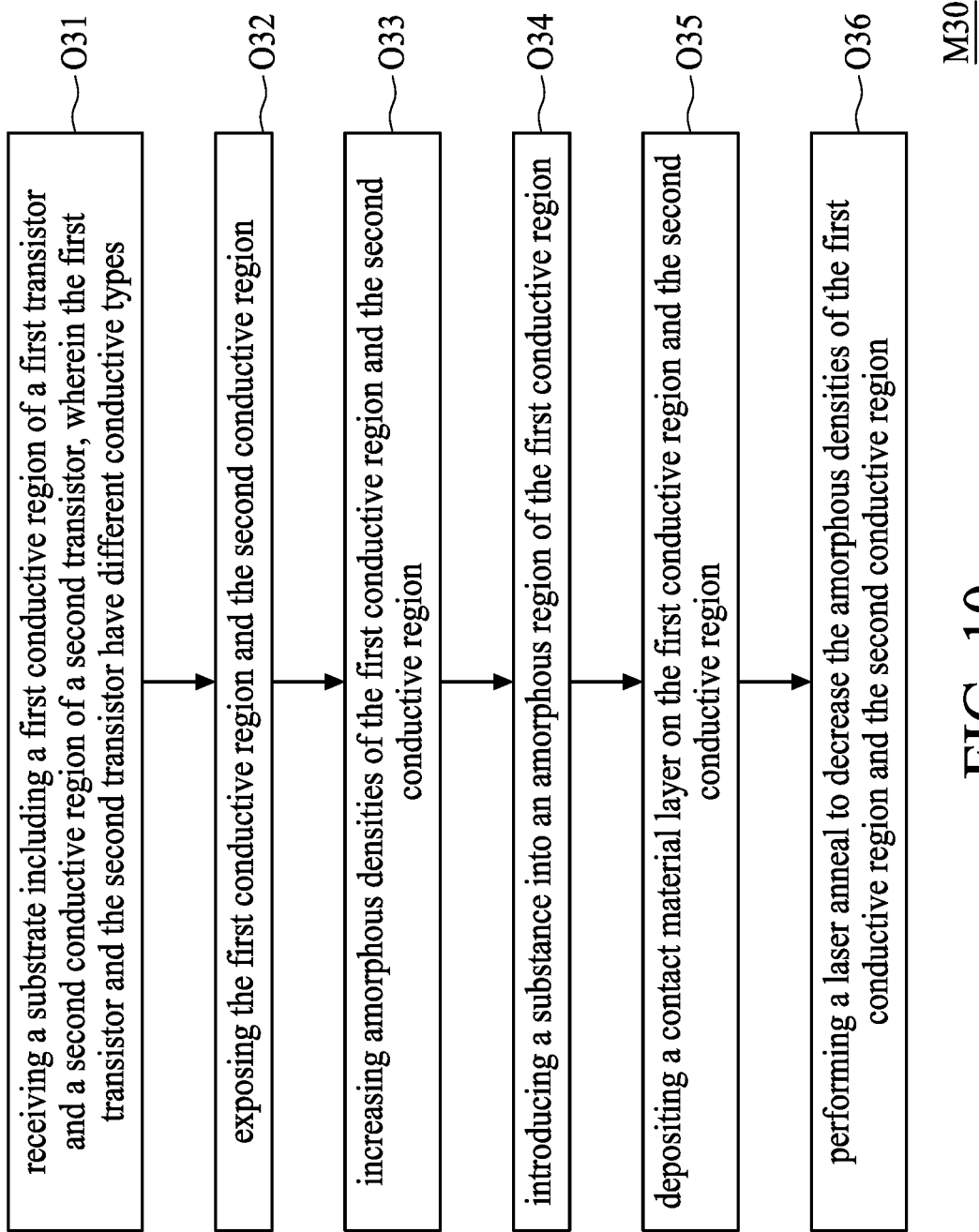
FIG. 10 is a flowchart of a method for manufacturing a semiconductor structure in accordance with some embodiments of the present disclosure.

Under the same concepts, and in addition to the above-illustrated method M10, the present disclosure also provides a method M20 for manufacturing a semiconductor structure, as shown in FIG. 9. The method M20 includes: (O21) receiving a substrate including a first conductive region of a first transistor and a second conductive region of a second transistor, wherein the first transistor and the second transistor have different conductive types; (O22) impacting a first substance over the first conductive region and the second conductive region; (O23) implanting a second substance into the first conductive region; (O24) depositing a third substance over the first conductive region and the second conductive region; and (O25) increasing crystalline densities of the first conductive region and the second conductive region by a laser anneal. The present disclosure also provides a method M30 for manufacturing a semiconductor structure, as shown in FIG. 10. The method M30 includes: (O31) receiving a substrate including a first conductive region of a first transistor and a second conductive region of a second transistor, wherein the first transistor and the second transistor have different conductive types; (O32) exposing the first conductive region and the second conductive region; (O33) increasing amorphous densities of the first conductive region and the second conductive region; (O34) introducing a substance into an amorphous structure of the first conductive region; (O35) depositing a contact material layer on the first conductive region and the second conductive region; and (O36) performing a laser anneal to decrease the amorphous densities of the first conductive region and the second conductive region.

Formations of source/drain contact vias, gate contacts, interconnection structures, etc. can be performed after the methods of the present disclosure, as illustrated above. Defects in crystal lattice of the conductive regions resulting from the amorphization make dopant activation difficult as a thermal budget is highly constrained. The present disclosure provides methods for manufacturing semiconductor structures, wherein the methods include operations to repair the defects of crystal lattice prior to formation of source/drain contact vias and other subsequent operations. Desired properties of the silicide layer, sources and drains are ensured by the thermal anneal and the laser anneal. The laser anneal of the present disclosure can improve dopant activation and contact resistances of the transistors by repairing the amorphous structures, in which lattice dislocation is caused by the amorphization and implantation performed during the formation of the source/drain regions and the silicide layer. Moreover, only one amorphization is required for both the dopant implantation and the silicide phase transformation. Only a single operation incurring damage to the crystal structures of the source/drain regions of the transistors across a wafer is required. As a result, the method of the present disclosure results in less damage to the crystal structures, easier recovery of the crystal structures by the laser anneal, and smaller possibility of phase transformation of the silicide layer. Thus, better performance of the semiconductor structures, attributed to low contact resistance, can be provided by the disclosed method.

Some embodiments of the present disclosure provide a method for manufacturing a semiconductor structure. The method includes: receiving a substrate including a first conductive region of a first transistor and a second conductive region of a second transistor, wherein the first transistor and the second transistor have different conductive types; performing an amorphization on the first conductive region and the second conductive region; performing an implantation over the first conductive region of the first transistor; forming a contact material layer over the first conductive region and the second conductive region; performing a thermal anneal on the first conductive region and the second conductive region; and performing a laser anneal on the first conductive region and the second conductive region.

Some embodiments of the present disclosure provide a method for manufacturing a semiconductor structure. The method includes: receiving a substrate including a first conductive region of a first transistor and a second conductive region of a second transistor, wherein the first transistor and the second transistor have different conductive types; impacting a first substance over the first conductive region and the second conductive region; implanting a second substance into the first conductive region; depositing a third substance over the first conductive region and the second conductive region; and increasing crystalline densities of the first conductive region and the second conductive region by a laser anneal.

Some embodiments of the present disclosure provide a method for manufacturing a semiconductor structure. The method includes: receiving a substrate including a first conductive region of a first transistor and a second conductive region of a second transistor, wherein the first transistor and the second transistor have different conductive types; exposing the first conductive region and the second conductive region; increasing amorphous densities of the first conductive region and the second conductive region; introducing a substance into an amorphous structure of the first conductive region; depositing a contact material layer on the first conductive region and the second conductive region; and performing a laser anneal to decrease the amorphous densities of the first conductive region and the second conductive region.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   receiving a substrate including a first conductive region and a first gate structure of a first transistor and a second conductive region and a second gate structure of a second transistor, wherein the first transistor and the second transistor have different conductive types;
   consuming a thickness of a first spacer on a vertical surface of the first gate structure and a thickness of a second spacer on a vertical surface of the second gate structure;
   forming a liner layer over the first spacer and the second spacer;
   performing an amorphization on the first conductive region and the second conductive region concurrently by a first implantation;
   performing a second implantation to introduce a P-type dopant on the first conductive region;
   forming a contact material layer over the first conductive region and the second conductive region, wherein the first conductive region is implanted by the first implantation and the second implantation prior to the formation of the contact material layer, and the second conductive region is implanted by the first implantation prior to the formation of the contact material layer;
   performing a thermal anneal on the first conductive region and the second conductive region; and
   performing a laser anneal on the first conductive region and the second conductive region.

2. The method of claim 1, wherein a temperature of the thermal anneal is lower than a temperature of the laser anneal.

3. The method of claim 2, wherein the temperature of the thermal anneal is in a range of 500° C. to 650° C.

4. The method of claim 2, wherein the temperature of the laser anneal is in a range of 800° C. to 950° C.

5. The method of claim 1, wherein a duration of the thermal anneal is greater than a duration of the laser anneal.

6. The method of claim 5, wherein the duration of the laser anneal is within micro seconds.

7. The method of claim 1, wherein the thermal anneal is performed prior to the laser anneal.

8. The method of claim 7, wherein a silicide layer is formed from the contact material layer by the thermal anneal.

9. The method of claim 8, wherein amorphous structures of the first conductive region and the second conductive region respectively are transformed into crystalline structures by the laser anneal.

10. The method of claim 1, wherein the formation of the contact material layer is performed immediately after the second implantation.

11. A method for manufacturing a semiconductor structure, comprising:
receiving a substrate including a first conductive region of a first transistor and a first gate structure, and a second conductive region and a second gate structure of a second transistor, wherein the first transistor and the second transistor have different conductive types;
removing a portion of a first spacer of the first gate structure and a portion of a second spacer of the second gate structure, thereby reducing a thickness of the first spacer on a vertical surface of the first gate structure and reducing a thickness of the second spacer on a vertical surface of the second gate structure;
depositing a liner layer covering the first spacer and the second spacer after the removal of the portion of the first spacer and the portion of the second spacer;
impacting a first substance over the first conductive region and the second conductive region;
implanting a second substance into the first conductive region;
depositing a third substance over the first conductive region and the second conductive region, wherein only the first substance is introduced into the second conductive region prior to the deposition of the third substance, and only the first substance and the second substance are introduced into the first conductive region prior to the deposition of the third substance; and
increasing crystalline densities of the first conductive region and the second conductive region by a laser anneal.

12. The method of claim 11, wherein the impact of the first substance over the first conductive region and the second conductive region results in a first reduced crystalline density of the first conductive region and the second conductive region.

13. The method of claim 12, wherein the implantation of the second substance into the first conductive region results in a second reduced crystalline density of the first conductive region from the first reduced crystalline density of the first conductive region.

14. The method of claim 13, wherein the second reduced crystalline density is less than the first reduced crystalline density.

15. The method of claim 11, wherein the first substance is selected from silicon, germanium, and argon.

16. The method of claim 11, wherein the first substance is selected from one or more elements in the group IVA and VIIIA on the periodic table.

17. A method for manufacturing a semiconductor structure, comprising:
receiving a substrate having a first source/drain (S/D) region and a first gate structure of a first transistor, and a second S/D region and a second gate structure of a second transistor formed thereon, wherein the first transistor and the second transistor have different conductive types;
reducing a thickness of a first spacer on a vertical surface of the first gate structure and a thickness of a second spacer on a vertical surface of the second gate structure;
disposing a liner layer over the substrate covering the first spacer and the second spacer, the first S/D region and the second S/D region;
exposing the first S/D region and the second S/D region;
increasing amorphous densities of the first S/D region and the second S/D region, thereby providing a first amorphous density of a surficial portion of the first S/D region and a second amorphous density of a surficial portion of the second S/D region;
introducing a substance into an amorphous structure of the first S/D region, wherein an amorphous density of the surficial portion of the first S/D region is increased from the first amorphous density to a third amorphous density;
depositing a contact material layer on the first S/D region and the second S/D region, wherein amorphous densities of the surficial portion of the first S/D region and the surficial portion of the second S/D region remain unchanged prior to the deposition of the contact material, and the contact material is in direct contact with the surficial portion of the first S/D region having the third amorphous density and the surficial portion of the second S/D region having the second amorphous density; and
performing a laser anneal to decrease the amorphous densities of the first S/D region and the second S/D region.

18. The method of claim 17, wherein a silicide layer is formed from the contact material layer by the laser anneal.

19. The method of claim 18, further comprising:
performing a rapid thermal anneal to shift a phase of lattice of the silicide layer.

20. The method of claim 17, wherein the exposing of the first S/D region and the second S/D region comprises:
performing a directional etching to expose the first S/D region and the second S/D region from the linear layer.

* * * * *